United States Patent
Wei

[11] Patent Number: 5,894,158
[45] Date of Patent: Apr. 13, 1999

[54] HAVING HALO REGIONS INTEGRATED CIRCUIT DEVICE STRUCTURE

[75] Inventor: Che-Chia Wei, Plano, Tex.

[73] Assignee: STMicroelectronics, Inc., Carrollton, Tex.

[21] Appl. No.: 07/769,185

[22] Filed: Sep. 30, 1991

[51] Int. Cl.[6] .................. H01L 29/76; H01L 31/062; H01L 31/113
[52] U.S. Cl. .................. 257/408; 257/336; 257/344
[58] Field of Search ................... 357/23.8, 23.11; 437/44, 47; 257/213, 288, 336, 344, 408

[56] References Cited

U.S. PATENT DOCUMENTS

| | | | |
|---|---|---|---|
| 4,342,149 | 8/1982 | Jacobs et al. | 29/576 |
| 4,597,824 | 7/1986 | Shinada et al. | 156/643 |
| 4,642,878 | 2/1987 | Maeda | 29/571 |
| 4,771,014 | 9/1988 | Liou et al. | 437/41 |
| 4,843,023 | 6/1989 | Chiu et al. | 437/34 |
| 4,855,246 | 8/1989 | Codella et al. | 437/41 |
| 4,894,694 | 1/1990 | Cham et al. | 357/23.3 |
| 4,950,617 | 8/1990 | Kumagai et al. | 437/41 |
| 4,968,639 | 11/1990 | Bergonzoni | 437/57 |
| 5,227,321 | 7/1993 | Lee et al. | 437/44 |

FOREIGN PATENT DOCUMENTS

| | | |
|---|---|---|
| 62-163374 | 7/1987 | Japan . |
| 63-3025165 | 9/1988 | Japan . |

OTHER PUBLICATIONS

Ogura et al., "A Half Micron MOSFET using Double Implanted LDD" paper 29.6 from the 1982 IEDM Digest1.
Ogura et al., "A half micron MOSFET using double implanted LDD" 1982 IEDM Technical Digest pp. 718–721.
Patent Abstracts of Japan, vol. 009, No. 197 (E–335), Aug. 14, 1985 & JP–A–60 064472 (Toshiba KK), Apr. 13, 1985.
IEEE Journal of Solid–State Circuits, Apr. 1989, USA, vol. 24, No. 2, ISSN 0018–9200, pp. 380–387, XP0000050753 Liou F–T et al: A 0.8–mu m CMOS technology for high–performance ASIC memory and channelless gate array.
Patent Abstracts of Japan, vol. 010, No. 133 (E–404), May 17, 1986 & JP–A–60 263468(Toshiba KK), Dec. 26, 1985 *abstract; figure 1*.
Patent Abstracts of Japan, vol. 009, No. 277 (E–335), Nov. 6, 1985 & JP–A–60 121765 (Toshiba KK), Jun. 29, 1985 *abstract; figure 4*.
Patent Abstracts of Japan, vol. 013, No. 139 (E–738), Apr. 6, 1989 & JP–A–63 302565 (Sanyo Electric Co. Ltd), Dec. 9, 1988. *abstract; figures 1,2*.
Patent Abstracts of Japan, vol. 004, No. 189 (E–039), Dec. 25, 1980 & JP–A–55 130171 (Fujitsu Ltd), Oct. 8, 1980, *abstract; figure 3*.
Electronics Letters, Feb. 4, 1988, UK, vol. 24, No. 3, ISSN 0013–5194, pp. 146–147, XP002000188, Yoshimi M et al.; Study of the operation speed of half–micron design rule CMOS ring oscillators.
Lineback,J.Robert, "Triple Diffusion doubles RAM Speed", Electronics May 5, 1983, pp. 54, 61.

*Primary Examiner*—Valencia Wallace
*Assistant Examiner*—Jean M. Arroyo
*Attorney, Agent, or Firm*—Theodore E. Galanthay; Lisa K. Jorgenson; Christopher F. Regan

[57] ABSTRACT

A mask is used for lightly doped drain and halo implants in an integrated circuit device. The mask exposes only portions of the substrate adjacent to field effect transistor gate electrodes. Since the halo implant is made only near the transistor channels, where it performs a useful function, adequate device reliability and performance is obtained. Since the halo implant is masked from those portions of the active regions for which it is not necessary, active region junction capacitances are lowered. Such lowered capacitances result in an improved transistor switching speed. The mask used to define the lightly doped drain and halo implant region can be easily formed from a straight forward combination of already existing gate and active area geometries.

21 Claims, 2 Drawing Sheets

HAVING HALO REGIONS INTEGRATED CIRCUIT DEVICE STRUCTURE

BACKGROUND OF THE INVENTION

1. Field of the Invention

The present invention relates generally to the fabrication of integrated circuit devices, and more particularly to a technique for reducing junction capacitances in field effect transistors.

2. Description of the Prior Art

Integrated circuit device geometries well below one micron feature sizes continue to become increasingly common. In general, the use of smaller devices on integrated circuit chips results in better performance and high packing density, thereby reducing cost while increasing performance. However, with such small feature sizes device performance is significantly adversely impacted by physical effects which can be largely ignored with larger devices. Therefore, transistor reliability becomes an important issue in the sub-micron regime.

One problem which is important for small geometry devices is known as the hot electron effect. This effect refers generally to the injection of energetic electrons from the channel region into the gate, causing degradation of transistor parameters such as threshold voltage and transconductance, therefore resulting in decreased performance. The effect is more pronounced for n-channel devices. Numerous transistor designs have been proposed and investigated in order to solve the hot electron injection problem.

One approach to dealing with the hot electron effect utilizes lightly doped drains (LDD) and a halo implant. Halo implants are moderately doped implants of the same conductivity type as the well or substrate in which the transistor is formed, and which lie in a thin layer generally along the source/drain to substrate/well junctions. A combination of LDD structures and halo implants has proven to achieve good device performance and reliability. However, due to the extra impurities used to form the halo in the junction areas, higher junction capacitances are obtained. This is true for both n-channel and p-channel devices. These increased junction capacitances tend to adversely impact transistor switching speeds.

It would be desirable to provide a method for fabricating integrated circuit transistors which provides good protection from hot electron effects. It is further desirable for such a method to minimize source/drain capacitances to improve operating speeds for the device.

SUMMARY OF THE INVENTION

Therefore, according to the present invention, a mask is used for lightly doped drain and halo implants in an integrated circuit device. The mask exposes only portions of the substrate adjacent to field effect transistor gate electrodes. Since the halo implant is made only near the transistor channels, where it performs a useful function, adequate device reliability and performance is obtained. Since the halo implant is masked from those portions of the active regions for which it is not necessary active region junction capacitances are lowered. Such lowered capacitances result in an improved transistor switching speed. The mask used to define the lightly doped drain and halo implant region can be easily formed from a straight forward combination of already existing gate and active area geometries.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
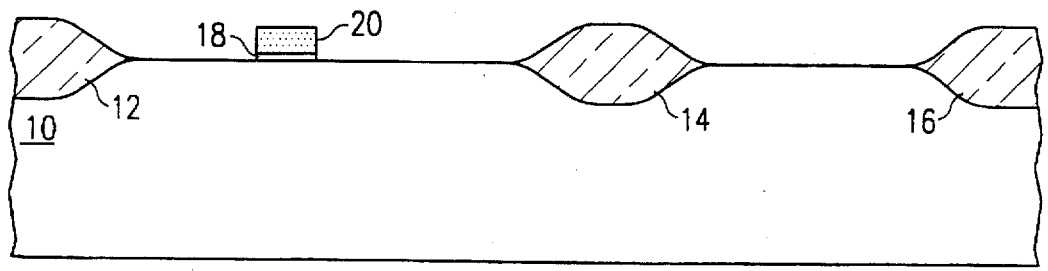
FIGS. 1–3 illustrate a preferred method for forming integrated circuit transistors according to the present invention.

Referring to FIG. 1, an integrated circuit device will be formed on a substrate 10. Field oxide regions 12, 14, 16 are defined and grown as known in the art. A field effect transistor gate electrode, consisting of a gate oxide layer 18 and a polycrystalline silicon layer 20, is formed as known in the art. The polycrystalline silicon layer 20 may be silicided with a refractory metal to increase conductivity.

To this point, the processing steps have been conventional. At this stage of the fabrication process, the device is ready for a lightly doped drain (LDD) and halo implant.

Figure 2:
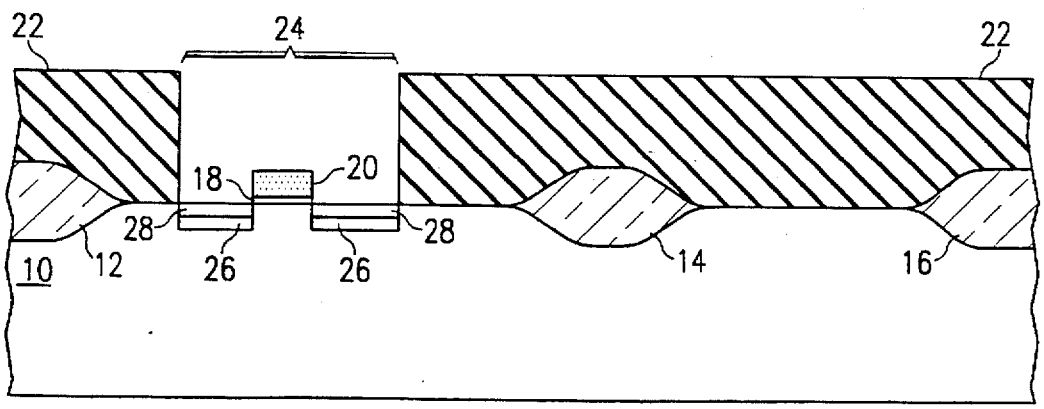

Referring to FIG. 2, a layer of photoresist 22 is applied to the device and patterned to define an opening 24. The opening 24 exposes the gate electrode and adjacent regions of the substrate 10. Other regions of the substrate are covered, and thus protected from implantation of impurities.

Impurities used to define a halo region 26 and LDD region 28 are implanted into the substrate 10 through the opening 24. For an n-channel transistor, regions 28 are doped n⁻, and halo regions 26 are doped p-type. For a p-channel transistor, the LDD regions 28 are doped p⁻ and the halo regions 26 are doped n-type.

Figure 3:
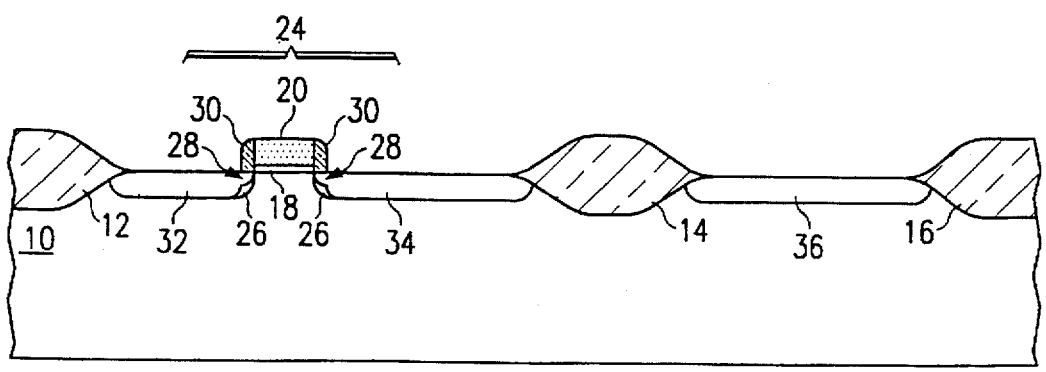

Referring to FIG. 3, the resist layer 22 is removed and sidewall spacers 30 formed as known in the art using an oxide layer deposition and anisotropic etchback. After formation of the sidewall spacers 30, heavily doped source/drain regions 32, 34, 36 are implanted. Diffusion of the source/drain regions, LDD regions, and halo regions is caused by a thermal annealing step to activate the implants. This results in a structure approximately as shown in FIG. 3, with the halo regions 26 helping to minimize the hot electron effect as is known in the art.

Because most of the active regions were masked by the resist layer 22 while the halo regions 26 were implanted, the increased junction capacitance caused-by implantation of the halo regions 26 occurs only within the region 24 near the gate electrode. The remainder of active regions 32 and 34, and the entirety of region 36, are not subjected to the halo implant. In these regions, the source/drain junction capacitance has a relatively low value.

In the preferred method, the LDD implants are made with the photoresist layer 22 in place. Although the LDD implant also does not extend into active regions not adjacent the gate electrode, this has little effect since the LDD regions 28 are effective only at the ends of the channel region underneath the gate oxide 18.

Figure 4:
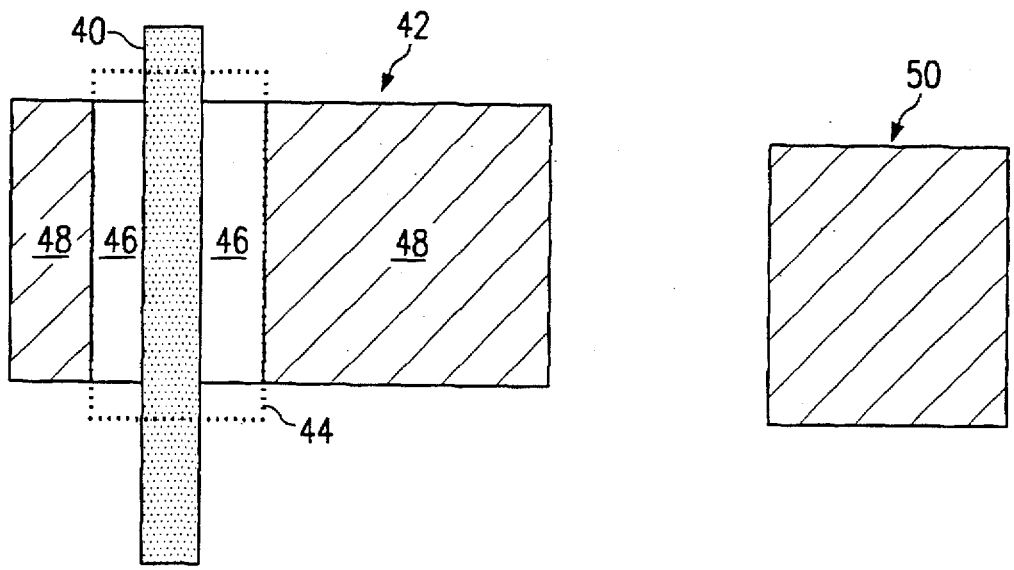
FIGS. 4 and 5 illustrate partial semiconductor integrated circuit layouts illustrating use of the preferred technique.

FIG. 4 is a top view of a portion of a hypothetical integrated circuit device illustrating a preferred masking layout for resist layer 22. In FIG. 4, gate electrode 40 overlies rectangular active region 42. A rectangular photoresist mask opening is defined by dotted line 44. The halo and LDD implants are made only into regions 46 within the active region 42. The remaining portions 48 of active region 42 do not receive the halo implant. In addition, active region 50, which does not contain a gate electrode, receives no halo implant at all.

The area in which the increased junction capacitance occurs is the region 46 adjacent to the gate electrode 40. Since only a relatively small portion of the total active area has such a halo implant, the total increase in junction capacitance for the device, above that which would exist without any halo implants at all, is relatively modest.

Figure 5:
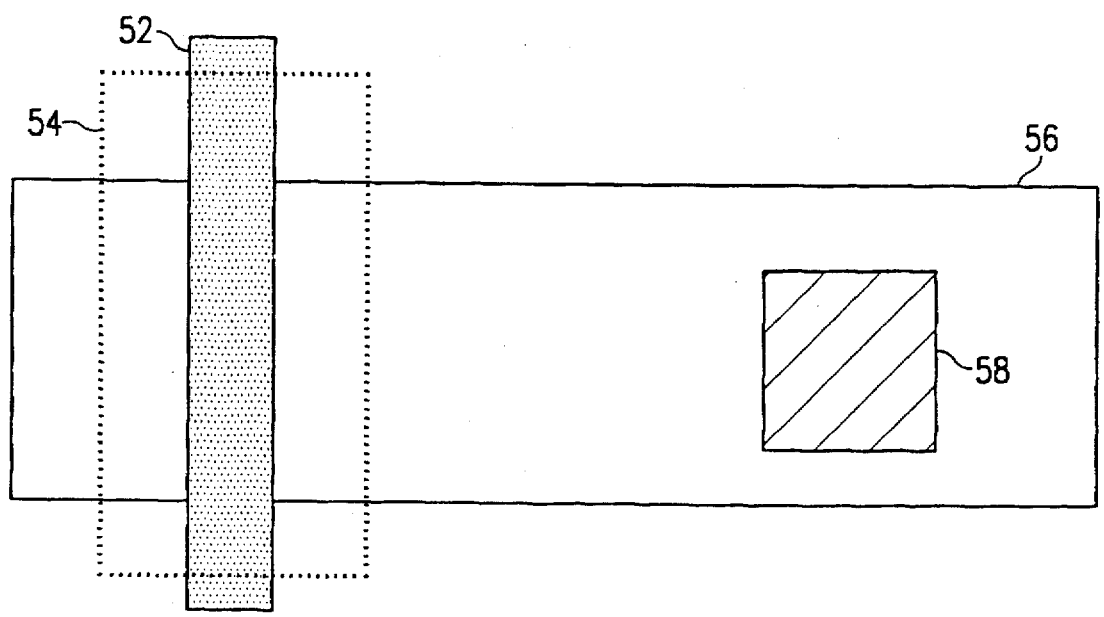

FIG. 5 shows another layout, with a gate electrode 52 and mask opening 54 as shown. Active region 56 is one source/drain region for the transistor defined by gate electrode 52, and is used to make a contact with an interconnect contact location 58. Again, it will be seen that the halo implant is confined to the regions near the gate electrode, so that the overall increase in junction capacitance is relatively low.

The mask used to pattern the photoresist to define the openings 44 and 54 can be created by generating a mask which is the intersection of the poly gate and the active region geometries The openings thus formed are then enlarged somewhat in order to accommodate possible misalignment and to ensure that the halo and LDD implants will extend for some distance laterally of the channel region. The n-channel halo implant mask can only be performed in the p-well region, and the p-channel halo implant mask can only be performed in the n-well region. Combining already defined and tested patterns in this way helps to minimize pattern generation complexity.

It will be appreciated by those skilled in the art that the described technique can lead to a significant decrease in junction capacitance for integrated circuit devices. The extent of the capacitance decrease is dependent in large part upon the ratio of the area which receives the halo implant to that which does not. The halo implant is eliminated entirely in regions which do not have gate electrodes, such as active interconnections and contact regions used for well strapping If desired, the mask used to pattern the resist layer 22 for the LDD and halo implant can also be used for the threshold voltage ($V_T$) implants Eliminating the ($V_T$) implants can provide a further reduction in junction capacitance because the implant tends to increase the surface carrier concentration, especially in n-channel devices. Reuse of the same mask for this purpose provides improved transistor performance, and minimal additional cost and complexity to the fabrication process.

While the invention has been particularly shown and described with reference to a preferred embodiment, it will be understood by those skilled in the art that various changes in form and detail may be made therein without departing from the spirit and scope of the invention.

What is claimed is:

1. A field effect transistor for an integrated circuit device, comprising:

a substrate region having a first conductivity type;

a gate electrode over said substrate region;

lightly doped drain regions in said substrate region adjacent said gate electrode, said lightly doped drain regions having a second conductivity type;

heavily doped source/drain regions having the second conductivity type in said substrate region adjacent said lightly doped drain regions; and halo regions having the first conductivity type within said substrate region adjacent said gate electrode and extending a relatively short distance into said source/drain regions, wherein those portions of said source/drain regions which are spaced further from said gate electrode than the relatively short distance do not contain the first conductivity type dopant used to form the halo regions.

2. The structure of claim 1, wherein the first conductivity type is n-type and the second conductivity type is p-type.

3. The structure of claim 1, wherein the first conductivity type is p-type and the second conductivity type is n-type.

4. The structure of claim 1, further comprising:

a threshold adjust implant region within the substrate region under said gate electrode and extending laterally therefrom, said threshold adjust implant region having a lateral extent approximately coincident with said halo regions.

5. The structure of claim 1, further comprising a second substrate region having the second conductivity type;

a second gate electrode over said second substrate region;

lightly doped drain regions in said second substrate region adjacent said second gate electrode, said lightly doped drain regions having the first conductivity type;

heavily doped source/drain regions having the first conductivity type in said second substrate region adjacent said lightly doped drain regions; and halo regions having the second conductivity type within said second substrate region adjacent said second gate electrode and extending a second relatively short distance into said source/drain regions, wherein those portions of said source/drain regions which are spaced further from said second gate electrode than the second relatively short distance do not contain the second conductivity type dopant used to form the halo regions.

6. An integrated circuit device, comprising:

a substrate having a region of monolithic semiconductor material near a first surface thereof;

a conductive gate electrode capacitively coupled to said semiconductor material near said first surface, to define a channel region therein;

a source region and a drain region within said semiconductor material, both doped with a first conductivity type;

said source and drain regions being separated by said channel region, such that the voltage of said gate will control inversion of said channel region to selectably block conduction between said source and drain regions;

wherein portions of said source and drain regions closest to said gate electrode have a diffusion profile corresponding to the overlaid combination of a first diffusion of said first conductivity type, which provides the majority of the doping of said source and drain regions;

a second diffusion, of said first conductivity type, which has a longer lateral diffusion length toward said gate than does said first diffusion, and a third diffusion, of a second conductivity type, which has a longer lateral diffusion length toward said gate than does said first diffusion, and which has a greater depth than said second diffusion; and wherein other portions of said source and drain regions have a diffusion profile which includes said first diffusion but NOT said third diffusion.

7. The integrated circuit device of claim 6, wherein said first conductivity type is N-type.

8. The integrated circuit device of claim 6, wherein said first and second diffusions comprise two different dopant species.

9. The integrated circuit device of claim 6, wherein said second diffusion comprises phosphorus, and said first diffusion comprises arsenic.

10. The integrated circuit device of claim 6, wherein said second diffusion comprises phosphorus, and said first diffusion comprises arsenic.

11. The integrated circuit device of claim 6, wherein said gate is separated from said channel by a thin layer of silicon dioxide.

12. The integrated circuit device of claim 6, wherein said channel region, where not abutted by said source and drain, is abutted by an isolation region.

13. The integrated circuit device of claim 6, wherein said gate electrode predominantly comprises polysilicon.

14. An integrated circuit device, comprising:

a substrate having a region of monolithic semiconductor material near a first surface thereof;

a conductive gate electrode capacitively coupled to said semiconductor material near said first surface, to define a channel region therein;

a source region and a drain region within said semiconductor material, both doped with a first conductivity type;

said source and drain regions being separated by said channel region, such that the voltage of said gate will control inversion of said channel region to selectably block conduction between said source and drain regions;

wherein portions of said source and drain regions closest to said gate electrode have a diffusion profile corresponding to the overlaid combination of a first diffusion of said first conductivity type, which provides the majority of the doping of said source and drain regions;

a second diffusion, of said first conductivity type, which has a longer lateral diffusion length toward said gate than does said first diffusion, and a third diffusion, of a second conductivity type, which has a longer lateral diffusion length toward said gate than does said first diffusion, and which has a greater depth than said second diffusion; and wherein other portions of said source and drain regions have a diffusion profile which includes said first diffusion but NOT said second diffusion nor said third diffusion.

15. The integrated circuit device of claim 14, wherein said first conductivity type is N-type.

16. The integrated circuit device of claim 14, wherein said first and second diffusions comprise two different dopant species.

17. The integrated circuit device of claim 14, wherein said second diffusion comprises phosphorus, and said first diffusion comprises arsenic.

18. The integrated circuit device of claim 14, wherein said second diffusion comprises phosphorus, and said first diffusion comprises arsenic.

19. The integrated circuit device of claim 14, wherein said gate is separated from said channel by a thin layer of silicon dioxide.

20. The integrated circuit device of claim 14, wherein said channel region, where not abutted by said source and drain, is abutted by an isolation region.

21. The integrated circuit device of claim 14, wherein said gate electrode predominantly comprises polysilicon.

* * * * *